United States Patent [19]
Leenders

[11] Patent Number: 5,972,556
[45] Date of Patent: *Oct. 26, 1999

[54] THERMOGRAPHIC AND PHOTOTHERMOGRAPHIC MATERIALS FOR PRODUCING LITHOGRAPHIC PRINTING ELEMENTS AND PROCESSES THEREFOR

[75] Inventor: Luc Leenders, Herentals, Belgium

[73] Assignee: Agfa-Gevaert N.V., Mortsel, Belgium

[ * ] Notice: This patent issued on a continued prosecution application filed under 37 CFR 1.53(d), and is subject to the twenty year patent term provisions of 35 U.S.C. 154(a)(2).

[21] Appl. No.: 08/710,061

[22] Filed: Sep. 9, 1996

Related U.S. Application Data

[60] Provisional application No. 60/006,003, Oct. 26, 1995.

[30] Foreign Application Priority Data

Sep. 14, 1995 [EP] European Pat. Off. .............. 95202488

[51] Int. Cl.⁶ ................ G03F 7/34; G03F 7/06
[52] U.S. Cl. .................. 430/200; 430/204; 430/205; 430/254; 430/271.1; 430/273.1; 430/278.1; 430/302; 430/330; 430/964; 503/227
[58] Field of Search ................ 430/200, 204, 430/205, 253, 254, 203, 271.1, 964, 278.1, 330, 273.1, 302; 503/227

[56] References Cited

U.S. PATENT DOCUMENTS

| | | |
|---|---|---|
| 3,679,414 | 7/1972 | Mukherjee ................. 96/67 |
| 4,985,339 | 1/1991 | Koizumi et al. ................. 430/270.1 |
| 5,122,443 | 6/1992 | Takeda ................. 430/253 |
| 5,166,040 | 11/1992 | Takeda ................. 430/254 |
| 5,290,659 | 3/1994 | Takeda ................. 430/205 |
| 5,409,798 | 4/1995 | Kondo et al. ................. 430/253 |
| 5,533,452 | 7/1996 | Mouri et al. ................. 430/254 |

FOREIGN PATENT DOCUMENTS 0653686   5/1995   European Pat. Off. .

*Primary Examiner*—Richard L. Schilling
*Attorney, Agent, or Firm*—Baker & Botts, L.L.P.

[57] ABSTRACT

A (photo)thermographic material is provided, capable of being used to produce a lithographic printing plate, comprising a support, a hydrophobic thermosensitive layer and a hydrophilic surface adjoining the hydrophobic thermosensitive layer, the thermosensitive layer containing an ingredient A, for example a substantially light-insensitive organic silver salt, which upon negative or positive image-wise heating reacts with at least one other ingredient B, for example a reducing agent therefor, in thermal working relationship therewith, producing a moiety which changes the adhesion between the thermosensitive layer and an adjoining hydrophilic surface to an extent such that negative or positive image-wise separation of the hydrophobic thermosensitive layer from the adjoining hydrophilic surface is enabled.

16 Claims, No Drawings

THERMOGRAPHIC AND PHOTOTHERMOGRAPHIC MATERIALS FOR PRODUCING LITHOGRAPHIC PRINTING ELEMENTS AND PROCESSES THEREFOR

Benefit is claimed from Provisional application Ser. No. 60/006,003 filed Oct. 26, 1995.

FIELD OF THE INVENTION

The present invention relates to the production and application of lithographic printing plates. More specifically the invention is related to a lithographic plate on which ink receptive images may be formed by a process involving an image-wise thermal development process.

BACKGROUND OF THE INVENTION

Lithography is a process in which printing takes place from a plate with specially prepared surfaces, some areas of which are capable of accepting lithographic ink, whereas other areas, when moistened with water, are incapable of accepting the ink. The areas of the medium being printed which accept ink from those plate areas which have accepted ink, form the printing image areas, while those in contact with those plate areas unable to accept ink, form the background areas. For the purposes of the present invention areas of the lithographic plate capable of accepting the ink will be referred to as hydrophobic and those incapable, after prewetting with water, of accepting this ink will be referred to as hydrophilic.

In the art of negative-working lithography, printing plates are produced in which image areas of the plates are incapable, after prewetting with water, of accepting the oily and greasy lithographic ink (hydrophilic) and non-image areas are capable of accepting this ink (hydrophobic). Two variants are possible depending on whether the surface of the plate before image-wise treatment is hydrophobic or hydrophilic. In the variant in which the surface of the plate before image-wise treatment is hydrophobic, image-wise treatment renders the image areas hydrophilic, whereas in the variant in which the surface of the plate before imaging is hydrophilic, image-wise treatment corresponding to the negative of the image renders the non-image areas hydrophobic.

In the art of positive-working lithography, printing plates are produced in which image areas are capable of accepting the oily and greasy lithographic ink (hydrophobic) and non-image areas are incapable, after prewetting with water, of accepting this ink (hydrophilic). Two variants are also possible depending on whether the surface of the plate before image-wise treatment is hydrophobic or hydrophilic. In the variant in which the surface of the plate prior to image-wise treatment is hydrophobic, image-wise treatment corresponding to the negative of the image renders the non-image areas hydrophilic, whereas in the variant in which the surface of the plate before image-wise treatment is hydrophilic, the image-wise treatment renders the image-areas hydrophobic.

Image-wise treatment, or image-wise treatment corresponding to the negative of the image, for the production of lithographic printing plates can be carried out using actinic radiation, ionized radiation or heat, or a combination thereof in combination with appropriate processing of the plates.

The use of thermographic or photothermographic materials in the production of lithographic printing plates opens the possibility of using dry development techniques, which have the advantage, over conventional processes requiring development with externally applied (wet) developers, of being entirely dry processes developable without additional ingredients.

Thermal imaging or thermographic processes utilizing the reduction of substantially light-insensitive organic heavy metal salts by organic reducing agents to heavy metal particles upon the application of heat, are entirely dry processes developable without additional ingredients. Furthermore, such systems can be rendered photosensitive by the incorporation of a photosensitive agent capable after exposure of catalyzing the thermal reduction of the organic heavy metal salts by the reducing agents.

A process for forming an image is described in U.S. Pat. No. 4,210,711, comprising the image-wise exposure of a photosensitive image-forming material composed of a support and a layer of a thermoplastic photosensitive composition which is not adhesive at ordinary temperatures, heating the exposed photo-sensitive material in intimate contact with a peeling development carrier sheet at least one surface of which is composed of a thermoplastic material not adhesive at ordinary temperature to a temperature above the softening temperature of at least one of the photo-sensitive composition layer and the peeling development carrier-sheet from the photo-sensitive image-forming material at about or below the heating temperature thereby to form the exposed or unexposed area of the photo-sensitive composition layer on the peeling development sheet, and the corresponding unexposed or exposed area on the support, respectively as a separate image wherein the photo-sensitive composition contains a photosensitive polyhalogen compound, a photosensitive quinone, a photosensitive polymer, a silver halide or an organic silver salt.

A thermographic lithographic printing plate is described in U.S. Pat. No. 3,685,993 with a composition comprising a complex of a heat fusible phenolic resin and a high molecular weight water-soluble poly-ether, -amine or -amide polymer, and an organic silver salt oxidizing agent for the resin, the composition undergoing a visible change upon heating to form ink-receptive image areas.

The difference in ink-receptive behaviour of image and non-image areas in prior art thermographic processes for the production of lithographic plates is insufficient to yield high quality prints. Furthermore, such lithographic plates have sub-optimal printing properties e.g. insufficient ink-acceptance in the hydrophobic areas of the lithographic plate, low printing endurance etc.

OBJECTS OF THE INVENTION

It is therefore a first object of the invention to provide a thermographic material capable of being used to produce a lithographic printing plate with improved discrimination in ink-receptive behaviour between image and non-image areas of the lithographic printing plate.

It is a further object of the invention to provide a thermographic material capable of being used to produce a lithographic printing plate with improved printing endurance.

It is a still further object of the invention to provide a process for producing a lithographic printing plate with improved discrimination in ink-receptive behaviour between image and non-image areas.

It is a still further object of the invention to provide a process for producing a lithographic printing plate with improved printing endurance.

Further objects and advantages of the invention will become apparent from the description hereinafter.

SUMMARY OF THE INVENTION

The above mentioned objects are realised by the specific features according to the present invention.

A thermographic material is provided, according to the present invention, capable of being used to produce a lithographic printing plate, comprising a support, a hydrophobic thermosensitive layer and a hydrophilic surface adjoining this hydrophobic thermosensitive layer, the hydrophobic thermosensitive layer containing an ingredient A which upon heating reacts with at least one other ingredient B, in thermal working relationship with the ingredient A, producing a moiety which changes the adhesion between the hydrophobic thermosensitive layer and an adjoining hydrophilic surface.

The use of this thermographic material for the production of lithographic plates is also provided.

The use of this thermographic material for the production of lithographic printing plates is further provided, wherein the thermographic material is subjected to positive or negative image-wise thermal development and a positive or negative image-wise separation of the hydrophobic thermosensitive layer from the adjoining hydrophilic surface.

Preferred embodiments of the invention are disclosed in the dependent claims.

DETAILED DESCRIPTION OF THE INVENTION

While the present invention will hereinafter be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appending claims.

In the case of non-photosensitive thermographic materials, the image-wise thermal development step, according to the present invention, includes image-wise heating for example with a thermal head or with a laser in heat mode. In the case of photosensitive thermographic materials, i.e. photothermographic materials, of the present invention, the image-wise thermal development step consists of image-wise exposure with a source of actinic radiation followed by overall heating of the photothermographic materials.

Separation of those parts of the hydrophobic thermosensitive layer with reduced adhesion to the adjoining hydrophilic surface of those parts of the hydrophilic layer with reduced adhesion to the adjoining hydrophobic thermosensitive layer, according to the present invention, can be achieved by all techniques known to people skilled in the art, which do not adversely affect the quality of the lithographic printing plate thereby obtained e.g. cold lamination followed by stripping (such as with adhesive tape), brushing, wiping with a non-aggressive liquid such as 2-propanol, hot lamination followed by stripping etc.

A thermographic material is also provided, according to the present invention, wherein the ingredient A is a substantially light insensitive organic silver salt and the ingredient B in thermal working relationship with the ingredient A is a reducing agent capable upon heating of reducing the substantially light insensitive organic salt to produce a hydrophobic moiety which reduces the adhesion between the hydrophobic thermosensitive layer and the adjoining hydrophilic surface.

A thermographic material is further provided, according to the present invention, wherein a photosensitive agent is present in the hydrophobic thermosensitive layer which after exposure is capable of catalyzing the reaction between the ingredient A and the ingredient B to produce the moiety which changes the adhesion between the hydrophobic thermosensitive layer and the adjoining hydrophilic surface.

According to a particular embodiment of the present invention, the hydrophobic thermosensitive layer is coated on a hydrophilic surface. The hydrophilic surface may be the surface of a hydrophilic layer or may be the surface of the support.

According to another embodiment of the present invention, the hydrophobic thermosensitive layer is the outermost layer. In this case, according to the present invention, it will be coated on a hydrophilic surface and image-wise thermal development will produce a change in adhesion between the hydrophobic thermosensitive layer and this hydrophilic surface. In the use of the thermographic material for the production of lithographic printing plates, according to this embodiment, the parts of the hydrophobic thermosensitive layer removed will correspond to the thermally imaged parts or to the non-thermally imaged parts depending on whether thermal imaging results in a reduction or an increase in the adhesion of the hydrophobic thermosensitive layer to the adjoining hydrophilic surface.

In a further embodiment of the present invention, the hydrophilic layer is the outermost layer providing an adjoining hydrophilic surface for the hydrophobic thermosensitive layer. In this case, according to the present invention, image-wise thermal development will produce a change in adhesion between the surface of the hydrophilic layer adjoining the hydrophobic thermosensitive layer and the hydrophobic thermosensitive layer itself. In the use of the thermographic material, according to this embodiment, for the production of lithographic printing plates, the parts of the hydrophilic layer removed will correspond to the thermally imaged parts or the non-thermally imaged parts depending on whether thermal imaging results in a reduction or an increase in the adhesion of the the hydrophilic surface of the hydrophilic layer adjoining the hydrophobic layer and the hydrophobic thermosensitive layer. According to this embodiment, the hydrophobic thermosensitive layer may be coated on a hydrophilic surface provided that no delamination of the thermosensitive layer from this hydrophilic surface takes places during the image-wise thermal development process.

The thermosensitive layer may consist of one or more elements, the one or more elements comprising binder layers containing at least one of the ingredient A, the ingredient B, the photosensitive agent, a spectrally sensitizing dye, an acutance dye, or other ingredient active in the image-wise thermal development process with the proviso that ingredients involved in the reaction of ingredient A with ingredient B to produce upon thermal development the moiety which strongly changes the adhesion between the thermosensitive layer and an adjoining hydrophilic surface are in thermal working relationship with one another.

The ingredient A in the thermosensitive layer and the ingredient B in thermal working relationship with ingredient A make up a reaction couple which, according to the present invention, upon the application of heat is capable of producing a moiety capable of changing the adhesion between the hydrophobic thermosensitive layer and an adjoining hydrophilic surface. Examples of such reaction couples are: an organic heavy metal salt and a reducing agent therefor; an organic reducing agent and an oxidizing agent therefore; a thermally polymerizable monomer or monomers and a thermally activatable source of free radicals e.g. azo-compounds such as 4,4'-azobis(4-cyanovaleric acid), 1,1'-azobis (cyclohexanecarbonitrile), α,α'-azobisisobutyronitrile producing upon image-wise thermal development an adhesion-reducing or adhesion-increasing polymer; a masked thermally diffusible hydrophilic moiety (non-diffusible in masked form) whose mask is removable with combined action of heat and a base together with such a base producing upon image-wise thermal development an increased adhesion; a masked thermally diffusible hydrophobic moiety (non-diffusible in masked form) whose mask is removable with combined action of heat and a base together with such a base producing upon image-wise thermal development a reduced adhesion; a masked thermally diffusible hydrophilic moiety (non-diffusible in masked form) whose mask is removable with combined action of heat and an acid together with such an acid producing upon image-wise thermal development an increased adhesion; a masked thermally diffusible hydrophobic moiety (non-diffusible in masked form) whose mask is removable with combined action of heat and an acid together with such an acid producing upon image-wise thermal development a decreased adhesion etc.

Ingredient A may, for example, be a substantially light-insensitive organic heavy metal salt. Organic heavy metal salts particularly suited for use in the thermographic materials according to the present invention are organic silver, iron and nickel salts, with organic silver salts being preferred. Preferred organic silver salts according to the present invention are silver salts of aliphatic carboxylic acids known as fatty acids, wherein the aliphatic carbon chain has preferably at least 12 C-atoms, e.g. silver laurate, silver palmitate, silver stearate, silver oleate and silver behenate, which silver salts are also called "silver soaps"; and silver salts with a halogen atom or a hydroxyl on the aliphatic carboxylic acid, e.g. silver hydroxystearate. Silver salts of aromatic carboxylic acids and other carboxyl group-containing compounds including silver benzoate, a silver substituted benzoate such as silver 3,5-dihydroxybenzoate, silver gallate etc., silver phenylacetate; a silver salt of 3-carboxymethyl-4-methyl-4-thiazoline-2-thione or the like described in U.S. Pat. No. 3,785,830; a silver salt of an aliphatic carboxylic acid containing a thioether group as described in GB-P 1,111,492; silver dodecyl sulphonate described in U.S. Pat. No. 4,504,575; and silver di-(2-ethylhexyl)-sulfosuccinate described in EP-A 227 141 may be likewise used to produce a thermally developable silver image.

Silver salts of compounds containing mercapto or thione groups and derivatives thereof can also be used. Preferred examples of these compounds include a silver salt of 3-mercapto-4-phenyl-1,2,4-triazole, a silver salt of 2-mercaptobenzimidazole, a silver salt of 2-mercapto-5-aminothiadiazole, a silver salt of 2-(ethylglycolamido) benzothiazole, a silver salt of thioglycolic acid, a silver salt of a dithiocarboxylic acid; a silver salt as described in U.S. Pat. No. 4,123,274 and a silver salt of a thione compound such as a silver salt of 3-(2-carboxyethyl)-4-methyl-4-thiazoline-2-thione as disclosed in U.S. Pat. No. 3,301,678.

Furthermore, a silver salt of a compound containing an imino group may be used. Preferred examples of these compounds include silver salts of benzotriazole and derivatives thereof; silver salts of halogen-substituted benzotriazoles; silver salts of carboimidobenzotriazoles; silver salts of 1,2,4-triazoles or 1-H-tetrazoles as described in U.S. Pat. No. 4,220,709: silver salts of imidazoles and imidazole derivatives; other organic silver salts as described in GB-P 1,439,478, e.g. silver phthalazinone; etc. Further are mentioned silver imidazolates and the substantially light-insensitive inorganic or organic silver salt complexes described in U.S. Pat. No. 4,260,677.

Useful substantially light-insensitive organic iron salts are e.g. iron salts of an organic acid, e.g. the iron salts described in EP-A 520 404, more particularly iron o-benzoylbenzoate.

A useful substantially light-insensitive organic nickel salt, nickel stearate, is described in CA-P 763,903.

Ingredient B is preferably a reducing agent. Suitable organic reducing agents for the reduction of substantially light-insensitive organic heavy metal salts are organic compounds containing at least one active hydrogen atom linked to O, N or C, such as is the case with, aromatic di- and tri-hydroxy compounds; aminophenols; METOL (tradename); p-phenylenediamines; alkoxynaphthols, e.g. 4-methoxy-1-naphthol described in U.S. Pat. No. 3,094,41; pyrazolidin-3-one type reducing agents, e.g. PHENIDONE (tradename); pyrazolin-5-ones; indan-1,3-dione derivatives; hydroxytetrone acids; hydroxytetronimides; hydroxylamine derivatives such as for example described in U.S. Pat. No. 4,082,901; hydrazine derivatives; and reductones e.g. ascorbic acid; see also U.S. Pat. No. 3,074,809, 3,080,254, 3,094,417 and 3,887,378.

Preferred reducing agents among aromatic di- and tri-hydroxy compounds having at least two hydroxy groups in ortho- or para- position on the same aromatic nucleus, e.g. benzene nucleus, are hydroquinone and substituted hydroquinones, catechol and substituted catechols, pyrogallol and substituted pyrogallols, such as gallic acid and gallic acid esters. Particularly useful are polyhydroxy spiro-bis-indane compounds, especially these corresponding to the following general formula (I):

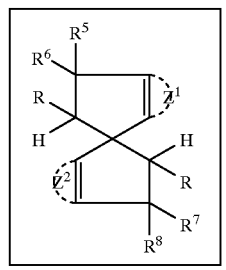

wherein
R represents hydrogen or alkyl, e.g. methyl or ethyl,
each of $R^5$ and $R^6$ (same or different) represents, an alkyl group, preferably methyl group or a cycloalkyl group, e.g. cyclohexyl group,
each of $R^7$ and $R^8$ (same or different) represents, an alkyl group, preferably methyl group or a cycloalkyl group, e.g. cyclohexyl group, and
each of $Z^1$ and $Z^2$ (same or different) represents the atoms necessary to close an aromatic ring or ring system, e.g. benzene ring, substituted with at least two hydroxyl groups in ortho- or para-position and optionally further substituted with at least one hydrocarbon group, e.g an alkyl or aryl group.

In particular, the polyhydroxy-spiro-bis-indane compounds described in U.S. Pat. No. 3,440,049 as photographic tanning agent are mentioned, more especially 3,3,3',3'-tetramethyl-5,6,5',6'-tetrahydroxy-1,1'-spiro-bis-indane and 3,3,3',3'-tetramethyl-4,6,7,4',6',7'-hexahydroxy-1,1'-spiro-bis-indane. Indane is also known under the name hydrindene.

Among the catechol-type reducing agents, by which is meant reducing agents containing at least one benzene nucleus with two hydroxy groups (—OH) in ortho-position, catechol, 3-(3,4-dihydroxyphenyl)propionic acid, 1,2-dihydroxybenzoic acid, gallic acid and its esters e.g. methyl gallate, ethyl gallate, propyl gallate, tannic acid, and 3,4-dihydroxy-benzoic acid esters are preferred. Particularly preferred catechol-type reducing agents, described in unpublished European Patent Application No. EP 9420154, are benzene compounds in which the benzene nucleus is substituted by no more than two hydroxy groups which are present in 3,4-position on the nucleus and have in the 1-position of the nucleus a substituent linked to the nucleus by means of a carbonyl group.

During the image-wise thermal development process the reducing agent must be present in such a way that it is able to diffuse to the substantially light-insensitive organic heavy metal salt particles to enable the reduction of the substantially light-insensitive organic heavy metal salt.

The above mentioned reducing agents, regarded as primary or main reducing agents, may be used in conjunction with so-called auxiliary reducing agents. Such auxiliary reducing agents are e.g. sterically hindered phenols, that on heating become reactive partners in the reduction of the substantially light-insensitive organic silver salt such as silver behenate, such as described in U.S. Pat. No. 4,001,026; or are bisphenols, e.g. of the type described in U.S. Pat. No. 3,547,648. The auxiliary reducing agents may be present in the imaging layer or in a polymeric binder layer in thermal working relationship thereto.

Preferred auxiliary reducing agents are sulfonamidophenols corresponding to the following general formula:

Aryl-SO$_2$—NH-Arylene-OH in which:

Aryl represents a monovalent aromatic group, and

Arylene represents a bivalent aromatic group, having the —OH group preferably in para-position to the —SO$_2$—NH— group.

Sulfonamidophenols according to the above defined general formula are described in Research Disclosure 17842 published in February 1979, U.S. Pat. No. 4,360,581, U.S. Pat. No. 4,782,004, and in EP-A 423 891, wherein these reducing agents are mentioned for use in a photothermographic material in which photosensitive silver halide is present in catalytic proximity to a substantially light-insensitive silver salt of an organic acid.

Other auxiliary reducing agents that may be used in conjunction with the above mentioned primary reducing agents are organic reducing metal salts, e.g. stannous stearate described in U.S. Pat. No. 3,460,946 and 3,547,648.

Photosensitive agents capable of rendering the thermographic materials photothermographic i.e. being able upon exposure of forming a species capable of catalyzing the reduction of the silver ions of the organic silver salt to silver by a reducing agent in thermal working relationship therewith upon the application of heat, should be in intimate contact with the organic silver salt. This can be achieved by producing the photosensitive agent "ex situ" and then adding it to the organic silver salt or "in situ" by preparing the photosensitive agent in the presence of the organic silver salt. Suitable photosensitive agents therefor are heavy metal organic or inorganic salts, preferably of a Group 1b metal of the Periodic Table, with metal diazo-sulfonate salts; salts of a hydrogen halide, such as chloride, bromide or iodide; or salts of nitric or sulfinic acid being preferred. Suitable metals include silver, copper, chromium, cobalt, platinum and gold; with silver being preferred. Mixtures of the above may also be used.

A simple test, which may be used to determine whether or not a particular metal salt can photogenerate a catalyst (free metal) for the reducing of the silver oxidizing agent with the reducing agent, is described in U.S. Pat. No. 3,152,904. First a freshly prepared sample of the metal salt in question (50 mg) is admixed with an aqueous or alcoholic suspension or dispersion (5 ml) of silver behenate (0.5 g). This dispersion is coated on filter paper and dried. The coated paper is then overcoated with aqueous or alcoholic solution of a 0.5% aqueous or alcoholic solution (5 ml) of a reducing agent, preferably hydroquinone and again dried. No immediate reaction should take place in the absence of light. This coated filter paper is then exposed to light (about 5–10 s with RS sun lamps—6 inches' distance) and heated to about 90–100° C. for 5 s. If the exposed paper darkens more rapidly than a similar paper sample under the same conditions without the metal salt, the salt is suitable as a photosensitive generator of a catalyst.

Preferred photosensitive agents are silver halides with silver chloride, silver bromide, silver bromochloride, silver bromoiodide, silver chlorobromoiodide and mixtures thereof being particularly preferred. Very fine grain photographic silver halide is especially useful. The photographic silver halide can be prepared by any of the known procedures in the photographic art. Such procedures for forming photographic silver halides and forms of photographic silver halides are described, for example, in Research Disclosure, December 1978, Item No. 17029 and Research Disclosure, June 1978, Item No. 17643. Tabular grain photosensitive silver halide is also useful, as described in, for example, U.S. Pat. No. 4,435,499. The photographic silver halide can be unwashed or washed, chemically sensitized, protected against the formation of fog and stabilized against the loss of sensitivity during keeping as described in the above Research Disclosure publications. The silver halides can be prepared in-situ as described in, for example, U.S. Pat. No. 4,457,075, or prepared ex-situ by methods known in the photographic art. In the case of ex-situ preparation, it may be present during the preparation of the organic heavy metal salt as described, for example, in U.S. Pat. No. 3,839,049 or mixed with the organic heavy metal salt after its preparation.

The photosensitive agent may be spectrally sensitized in the visible spectrum and in the IR-range of the spectrum with various known dyes including cyanine, merocyanine, styryl, hemicyanine, oxonol, hemioxonol and xanthene dyes. Useful cyanine dyes include those having a basic nucleus, such as a thiazoline nucleus, an oxazoline nucleus, a pyrroline nucleus, a pyridine nucleus, an oxazole nucleus, a thiazole nucleus, a selenazole nucleus and an imidazole nucleus. Useful merocyanine dyes which are preferred include those having not only the above described basic nuclei but also acid nuclei, such as a thiohydantoin nucleus, a rhodanine nucleus, an oxazolidinedione nucleus, a thiazolidinedione nucleus, a barbituric acid nucleus, a thiazolinone nucleus, a malononitrile nucleus and a pyrazolone nucleus. In the above described cyanine and merocyanine dyes, those having imino groups or carboxyl groups are particularly effective. The sensitizing power of these spectral sensitizers may be augmented by the use of so-called super-sensitizers such as described, for example for IR-spectral sensitizers in EP-A 559 228, U.S. Pat. No. 5,258,282 and JN63023145.

Thermographic materials rendered photosensitive by the presence of a photosensitive agent may contain anti-halation or acutance dyes which absorb light which has passed through the photosensitive layer, thereby preventing its reflection, such as described in U.S. Pat. No. 3,515,559, DE-P 1 927 412, U.S. Pat. No. 4,033,948, U.S. Pat. No.

4,197,131, EP-A 12 020, CA-P 1,139,149, U.S. Pat. No. 4,271,263, EP-B 101 646, EP-B 102 781, U.S. Pat. No. 4,752,559, EP-A 377 961, U.S. Pat. No. 5,300,420, EP-A 627 660, EP-A 652 473, U.S. Pat. No. 5,382,504 and U.S. Pat. No. 5,395,747.

The film-forming binder(s) of the elements of the thermosensitive layer containing ingredients (A) and (B) may be all kinds of natural, modified natural or synthetic resins or mixtures of such resins, wherein the organic heavy metal salt can be dispersed homogeneously: e.g. cellulose derivatives such as ethylcellulose, cellulose esters, e.g. cellulose nitrate, carboxymethylcellulose, starch ethers, galactomannan, polymers derived from $\alpha,\beta$-ethylenically unsaturated compounds such as polyvinyl chloride, after-chlorinated polyvinyl chloride, copolymers of vinyl chloride and vinylidene chloride, copolymers of vinyl chloride and vinyl acetate, polyvinyl acetate and partially hydrolyzed polyvinyl acetate, polyvinyl alcohol, polyvinyl acetals that are made from polyvinyl alcohol as starting material in which only a part of the repeating vinyl alcohol units may have reacted with an aldehyde, preferably polyvinyl butyral, copolymers of acrylonitrile and acrylamide, polyacrylic acid esters, polymethacrylic acid esters, polystyrene and polyethylene or mixtures thereof.

A particularly suitable polyvinyl butyral containing a minor amount of vinyl alcohol units is marketed under the trade name BUTVAR™ B79 by Monsanto USA and provides a good adhesion to paper and properly subbed polyester supports.

The above mentioned binders or mixtures thereof may be used in conjunction with waxes or "heat solvents" also called "thermal solvents" or "thermosolvents" improving the reaction speed of the redox-reaction at elevated temperature.

By the term "heat solvent" in this invention is meant a non-hydrolyzable organic material which is in a solid state in the recording layer at temperatures below 50° C., but becomes a plasticizer for the recording layer where thermally heated and/or a liquid solvent for at least one of the redox-reactants, e.g. the reducing agent for the substantially light-insensitive organic silver salt, at a temperature above 60° C. Useful for the purpose are the polyethylene glycols having a mean molecular weight in the range of 1,500 to 20,000 described in U.S. Pat. No. 3,347,675. Other suitable heat solvents are compounds such as urea, methyl sulfonamide and ethylene carbonate as described in U.S. Pat. No. 3,667,959; compounds such as tetrahydro-thiophene-1,1-dioxide, methyl anisate and 1,10-decanediol as described in Research Disclosure 15027 published in December 1976; and those described in U.S. Pat. No. 3,438,776, U.S. Pat. No. 4,740,446, U.S. Pat. No. 5,368,979, EP-A 0 119 615, EP-A 122 512 and DE-A 3 339 810.

In order to obtain improved shelf-life and reduced fogging, stabilizers and antifoggants may be incorporated into the thermographic materials of the present invention. Examples of suitable stabilizers and antifoggants and their precursors, which can be used alone or in combination, include the thiazolium salts described in U.S. Pat. No. 2,131,038 and 2,694,716; the azaindenes described in U.S. Pat. No. 2,886,437 and 2,444,605: the urazoles described in U.S. Pat. No. 3,287,135; the sulfocatechols described in U.S. Pat. No. 3,235,652; the oximes described in GB-P 623,448; the thiuronium salts described in U.S. Pat. No. 3,220,839; the palladium, platinum and gold salts described in U.S. Pat. No. 2,566,263 and 2,597,915; the tetrazolyl-thio-compounds described in U.S. Pat. No. 3,700,457; the 1,2,4-triazole compounds described in GB-P 1,547,326; the mesoionic 1,2,4-triazolium-3-thiolate stablizer precursors described in U.S. Pat. No. 4,404,390 and 4,351,896: the tribromomethyl ketone compounds described in EP-A 600 587; the combination of isocyanate and halogenated compounds described in EP-A 600 586; the vinyl sulfone and 5-halo sulfone compounds described in EP-A 600 589; and those compounds mentioned in this context in Chapter 9 of "Imaging Processes and Materials, Neblette's 8th edition", by D. Kloosterboer, edited by J. Sturge, V. Walworth and A. Shepp, page 279, Van Nostrand (1989): in Research Disclosure 17029 published in June 1978; and in the references cited in all these documents.

Thermographic and photothermographic materials according to the present invention may contain one or more toning agents. The toning agents should be in thermal working relationship with the substantially light-insensitive organic heavy metal salts and reducing agents during thermal processing. Any known toning agent from thermography or photothermography may be used.

Suitable toning agents are the phthalimides and phthalazinones within the scope of the general formulae described in U.S. Pat. No. 4,082,901 and the toning agents described in U.S. Pat. No. 3,074,809, U.S. Pat. No. 3,446,648 and U.S. Pat. No. 3,844,797. Particularly useful toning agents are the heterocyclic toner compounds of the benzoxazine dione or naphthoxazine dione type within the scope of following general formula are described in GB-P 1,439,478 and U.S. Pat. No. 3,951,660, in particular benzo[e][1,3]oxazine-2,4-dione.

In addition to these ingredients the recording layer may also contain other additives such as free fatty acids, surface-active agents, antistatic agents, e.g. non-ionic antistatic agents including a fluorocarbon group, e.g. $F_3C(CF_2)_6CONH(CH_2CH_2O)$—H; silicone oil, e.g. BAYSILONE™ O1 A (BAYER AG); ultraviolet light absorbing compounds and/or silica.

The support for the thermographic material according to the present invention may be transparent, translucent or opaque and is preferably a flexible carrier made e.g. from paper, polyethylene coated paper, metal, e.g. aluminium, an aluminum alloy, the aluminum content of which is at least 95%, or transparent resin film, e.g. made of a cellulose ester, e.g. cellulose triacetate, polypropylene. polycarbonate or polyester, e.g. polyethylene terephthalate. The support may be in sheet, ribbon or web form and subbed if needs be to improve the adherence to the thereon coated thermosensitive layer or made hydrophilic to provide a hydrophilic surface. The support may be made of an opacified resin composition, e.g. is made of opacified polyethylene terephthalate by means of pigments and/or micro-voids and/or is coated with an opaque pigment-binder layer, and may be called synthetic paper, or paperlike film; information about such supports can be found in EP's 194 106 and 234 563 and U.S. Pat. Nos. 3,944,699, 4,187,113, 4,780,402 and 5,059,579.

The preparation of aluminum or aluminum alloy foils with a hydrophilic surface, according to the present invention, comprises the following steps: graining, anodizing, and optionally sealing the foil. The electrochemical graining process is preferred because it can form a uniform surface roughness having a large average surface area with a very fine and even grain.

As described in "Handbook of Imaging Materials", edited by Arthur S. Diamond—Diamond Research Corporation—Ventura, Calif., published by Marcel Dekker, Inc. 270 Madison Avenue, New York, N.Y. 10016 (1991), p. 498–502 in thermal printing image signals are converted into electric pulses and then through a driver circuit selectively transferred to a thermal printhead. The thermal printhead consists of microscopic heat resistor elements, which convert the electrical energy into heat via Joule effect. The electric pulses thus converted into thermal signals manifest themselves as heat transferred to the surface of the thermal paper wherein the chemical reaction resulting in colour development takes place. Such thermal printing heads may be used in contact or close proximity with the recording layer. The operating temperature of common thermal printheads is in the range of 300 to 400° C. and the heating time per picture element (pixel) may be less than 1.0 ms, the pressure contact of the thermal printhead with the recording material being e.g. 200–500 g/cm$^2$ to ensure a good transfer of heat. Suitable thermal printing heads are e.g. a Fujitsu Thermal Head (FTP-040 MCS001), a TDK Thermal Head F415 HH7–1089 and a Rohm Thermal Head KE 2008-F3.

Thermographic materials can also be image-wise or pattern-wise heated by means of a modulated laser beam. For example, image-wise modulated infra-red laser light is absorbed in the thermographic material by infra-red light absorbing substances converting infrared radiation into the heat necessary for the imaging reaction. In this embodiment the thermographic material contains light-into-heat converting substances, e.g. infrared radiation absorbing substances such as described in WO 95/07822 and U.S. Pat. No. 5,409,797. The use of an infrared light emitting laser and a dye-donor element containing an infrared light absorbing material is described e.g. in U.S. Pat. No. 4,912,083. Suitable infra-red light absorbing dyes for laser-induced thermal dye transfer are described e.g. in U.S. Pat. No. 4,948,777, which U.S. Pat. No. documents for the dyes and lasers applied in direct thermal imaging have to be read in conjunction herewith.

The image-wise applied laser light has not necessarily to be infrared light since the power of a laser in the visible light range and even in the ultraviolet region can be thus high that sufficient heat is generated on absorption of the laser light in the thermographic material. There is no limitation on the kind of laser used which may be a gas laser, gas ion laser, e.g. argon ion laser, solid state laser, e.g. Nd:YAG laser, dye laser or semi-conductor laser.

In such thermographic materials light absorbing substances, so-called anti-halation or acutance dyes, may be necessary which absorb light which has passed through the layer, thereby preventing its reflection, such as described in U.S. Pat. No. 3,515,559, DE-P 1 927 412, U.S. Pat. No. 4,033,948, U.S. Pat. No. 4,197,131, EP-A 12 020, CA-P 1,139,149, U.S. Pat. No. 4,271,263, EP-B 101 646, EP-B 102 781, U.S. Pat. No. 4,752,559, EP-A 377 961, U.S. Pat. No. 5,300,420, EP-A 627 660, EP-A 652 473, U.S. Pat. No. 5,382,504 and U.S. Pat. No. 5,395,747.

The image signals for modulating the laser beam or current in the micro-resistors of a thermal printhead are obtained directly e.g. from opto-electronic scanning devices or from an intermediary storage means, e.g. magnetic disc or tape or optical disc storage medium, optionally linked to a digital image work station wherein the image information can be processed to satisfy particular needs.

European Patent Application No. 93203263.4 describes a method for making an image by image-wise heating by means of a thermal head having energizable heating elements, wherein the activation of the heating elements is executed duty cycled pulsewise.

Image-wise thermal development of the thermographic material can also be carried out using an electrically resistive ribbon incorporated into the material, consisting e.g. of a multilayered structure in which a carbon-loaded polycarbonate is coated with a thin aluminium film (ref. Progress in Basic Principles of Imaging Systems—Proceedings of the International Congress of Photographic Science Köln (Cologne), 1986 ed. by Friedrich Granzer and Erik Moisar— Friedr. Vieweg & Sohn—Braunschweig/Wiesbaden, FIG. 6. p. 622). Current is injected into the resistive ribbon by electrically addressing a printing head electrode contacting the carbon-loaded substrate. Thus resulting in highly localized heating of the ribbon beneath the energized electrode. The aluminium film may make direct contact with the heat-sensitive recording layer or its protective outermost layer.

The fact that in using a resistive ribbon thermographic material heat is generated directly in the resistive ribbon and only the travelling ribbon gets hot (not the print heads) an inherent advantage in printing speed is obtained. In the thermal printing head technology the various elements of the thermal printing head become hot and must cool down before the head can print without cross-talk in a next position.

Image- or pattern-wise thermal development of the thermographic material may also proceed by means of pixel wise modulated ultra-sound, using e.g. an ultrasonic pixel printer as described e.g. in U.S. Pat. No. 4,908,631.

The image signals for modulating the ultrasonic pixel printer, laser beam or electrode current are obtained directly e.g. from opto-electronic scanning devices or from an intermediary storage means, e.g. magnetic disc or tape or optical disc storage medium, optionally linked to a digital work station wherein the image information can be processed to satisfy particular needs.

Photothermographic materials, according to the present invention, may be exposed with radiation of wavelength between an X-ray wavelength and a 5 microns wavelength with the image either being obtained by pixel-wise exposure with a finely focussed light source, such as a UV, visible or IR wavelength laser, such as a He/Ne-laser or an IR-laser diode, e.g. emitting at 780, 830 or 850 nm; or a light emitting diode, for example one emitting at 659 nm; or by direct exposure to light reflected from the object itself or an image therefrom with appropriate illumination e.g. with UV, visible or IR light.

The coating of any layer of the thermal recording material of the present invention may proceed by any coating technique e.g. such as described in Modern Coating and Drying Technology, edited by Edward D. Cohen and Edgar B. Gutoff, (1992) VCH Publishers Inc. 220 East 23rd Street, Suite 909 New York, N.Y. 10010, U.S.A.

The following ingredients were used in the photothermographic recording material of the invention example illustrating the present invention:

in the photo-addressable thermally developable element

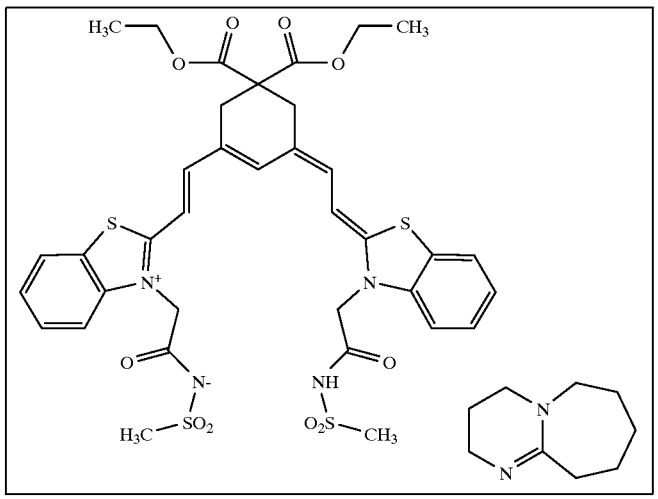

The following examples illustrate the present invention. The percentages and ratios used in the examples are by weight unless otherwise indicated.

INVENTION EXAMPLE 1

Thermosensitive Layer

A transparent subbed polyethylene terephthalate support having a thickness of 175 $\mu$m was doctor blade-coated from a coating composition containing 2-butanone as a solvent and the following ingredients so as to obtain thereon after drying a layer containing:

| | |
|---|---|
| silver behenate | 4.7 g/m² |
| polyvinylbutyral [Butvar™ B79 from Monsanto] | 18.9 g/m² |
| benzo [e] [1,3] oxazine-2,4-dione (toning agent) | 0.33 g/m² |
| n-butyl 3,4-dihydroxybenzoate (reducing agent) | 1.22 g/m² |
| silicone oil [Baysilone™ Ö1 from Bayer AG] | 0.04 g/m² |
| tetrachlorophthalic anhydride (stabilizer) | 0.15 g/m² |
| pimelic acid (inhibitor) | 0.5 g/m² |

Outermost Hydrophilic Layer

An outermost hydrophilic layer was doctor blade-coated onto the thermosensitive layer from an aqueous coating suspension containing the following ingredients in such quantities so as to yield after drying a coating containing:

| | |
|---|---|
| polyvinylalcohol [Polyviol™ WX48 20 from Wacker Chemie AG] | 2.2 g/m² |
| tetramethyl orthosilicate | 2.9 g/m² |
| polytetrafluoroethene powder [Hostaflon™ TF5032 from Hoechst AG] | 0.45 g/m² |
| polyamide wax [Ceridust™ 3910 from Hoechst AG] | 0.13 g/m² |
| talcum [Microace™ Talc P3 from Nippon Talc Co. Ltd. | 0.13 g/m² |
| sodium salt of an aryl sulfonate [Ultravon™ W from Ciba-Geigy AG] | 0.22 g/m² |
| 15% aqueous dispersion of colloidal silica [Levasil™ VP AC 4055 from Bayer AG] | 0.9 g/m² |

The outermost hydrophilic layer was then hardened at 57° C. and 34% RH for 3 days.

Thermal Development and Processing 10 cm×10 cm sheets of the resulting thermographic material were then image-wise thermally developed with a DRYSTAR™ printer from AGFA-GEVAERT N. V. (a thin film thermal head printer) operated at a resolution of 300 dpi, a line time of 19 ms (the line time being the time needed for printing one line), a duty cycle of 70%, an average printing power (being the total amount of electrical input energy during one line time divided by the line time and by the surface area of the heat-generating resistors) was 5W/mm² and an applied pressure between the thermographic material and the thermal head of ca. 230 g/linear cm along the thermal head.

After image-wise thermal development the sheet of thermographic material was allowed to cool to room temperature. The outermost hydrophilic layer on the same side of the thermographic material as the thermosensitive layer was then contacted with adhesive tape. TESA™4122 from Beiersdorf AG. The tape was then peeled off with those areas of the outermost hydrophilic layer corresponding to the image-wise thermally developed areas of the thermographic material still attached to it, thereby detaching these parts of the outermost hydrophilic layer from the thermosensitive layer.

Printing Experiments

An inking experiment was carried out with the resulting material using an offset printer type 360 Varn™ from A. B. Dick Inc, after prewetting with a 3% aqueous solution of G671 (trademark), a fountain solution from AGFA-GEVAERT NV, in which the image areas of the lithographic printing plate were found to accept the oily and greasy lithographic ink used, Rubberbase™ VS2329 printing ink from Van Son Inc., and the non-image areas did not accept this ink. This excellent discrimination in ink-receptive behaviour between image and non-image areas was confirmed by the sharp background-free prints obtained upon printing onto 80 g/m² offset paper, with a minimum optical density of 0.07 and a maximum optical density of 1.25, as measured through a visual filter using a RD 904 densitometer from MACBETH Inc.

INVENTION EXAMPLE 2

Aluminium Foil Support

A 0.15 mm thick aluminium foil lithographic plate was used which had been electrochemically roughened and anodized to form a hydrophilic surface with a surface topography with an average center-line roughness Ra. according to DIN 4768 and ISO 4287/1, of 0.5 µm, using convention production techniques for lithographic plates.

Silver Halide Emulsion

An silver halide emulsion consisting of 3.11% by weight of silver halide particles consisting of 97 mol % silver bromide and 3 mol % silver iodide with an weight average particle size of 50 nm, 0.47% by weight of phthaloylgelatin, type 16875 from ROUSSELOT as dispersing agent in deionized water was prepared using conventional silver halide preparation techniques such as described, for example, in T. H. James, "The Theory of the Photographic Process", Fourth Edition, Macmillan Publishing Co. Inc., New York (1977), Chapter 3, pages 88–104.

Silver Behenate/Silver Halide Emulsion

A silver behenate/silver halide emulsion was prepared by adding a solution of 6.8 kg of behenic acid in 67L of 2-propanol at 65° C. to a 400L vessel heated to maintain the temperature of the contents at 65° C., converting 96% of the behenic acid to sodium behenate by adding with stirring 76.8L of 0.25M sodium hydroxide in deionized water, then adding with stirring 10.5 kg of the above-described silver halide emulsion at 40° C. and finally adding with stirring 48L of a 0.4M solution of silver nitrate in deionized water. Upon completion of the addition of silver nitrate the contents of the vessel were allowed to cool and the precipitate filtered off, washed, slurried with water, filtered again and finally dried at 40° C. for 72 hours.

7kg of the dried powder containing 9 mol % silver halide and 4 mol % behenic acid with respect to silver behenate were then dispersed in a solution of 700 g of Butvar™ B76 in 15.6 kg of 2-butanone using convention dispersion techniques yielding a 33% by weight dispersion. 7.4 kg of 2-butanone were then added with stirring and the resulting dispersion homogenized in a microfluidizer. Finally 2.8 kg of Butvar™ B76 were added with stirring to produce a dispersion with 31% by weight of solids.

Coating and Drying of Silver Behenate/Silver Halide Emulsion Layer

The coating composition for the emulsion layer of the photothermographic material was prepared by adding the following solutions or liquids to 40.86 g of the above-mentioned silver behenate/silver halide emulsion in the following sequence with stirring: 6.87 g of 2-butanone, 0.95 g of a 9% solution of tetramethylammonium bromide perbromide in methanol followed by 2 hours stirring, 0.2 g of a 11% solution of calcium bromide in methanol and 1.39 g of 2-butanone followed by 30 minutes stirring, a solution consisting of 0.21 g of LOWINOX™ 22IB46, 0.5 g of TMPS and 9.24 g of 2-butanone followed by 15 minutes stirring, 1.8 g of a 0.11% solution of SENSI in methanol followed by 30 minutes stirring and finally 4.35 g of Butvar™ B76 followed by 45 minutes stirring.

The anodized (hydrophilic) side of above described aluminium foil was then doctor blade-coated at a blade setting of 100 µm with the coating composition of the emulsion layer of the photothermographic material to a wet layer thickness of 75 µm, which after drying for 5 minutes at 80° C. on an aluminium plate in a drying cupboard produced a layer with the following composition:

| Butvar™ B76 | 8.70 g/m² |
|---|---|
| Phthaloyl gelatine type 16875 from ROUSSELOT | 0.045 g/m² |
| $AgBr_{0.97}I_{0.03}$ | 0.301 g/m² |
| silver behenate | 7.929 g/m² |
| tetramethylammonium bromide perbromide | 0.0855 g/m² (15.2 mmol/mol silver behenate) |
| calcium bromide | 0.022 g/m² |
| LOWINOX™ 22IB46 | 0.210 g/m² |
| SENSI | 0.002 g/m² |
| TMPS | 0.500 g/m² |

Outermost Hydrophobic Layer

A outermost hydrophobic layer coating composition for the photothermographic material was prepared by dissolving 4.08 g of CAB and 0.16 g of PMMA in 56.06 g of 2-butanone and 5.2 g of methanol and adding the following solutions or liquids with stirring in the following sequence: 0.5 g of phthalazine, 0.2 g of 4-methylphthalic acid, 0.1 g of tetrachlorophthalic acid, 0.2 g of tetrachlorophthalic acid anhydride and a solution consisting of 2.55 g of LOWINOX™ 22IB46 and 5.95 g of 2-butanone.

The emulsion layer of the photothermographic material was then doctor blade-coated at a blade setting of 100 µm with a outermost hydrophobic layer composition to a wet layer thickness of 80 µm, which after drying for 8 minutes at 80° C. on an aluminium plate in a drying cupboard produced a layer with the following composition:

| PMMA | 0.16 g/m² |
|---|---|
| CAB | 4.08 g/m² |
| Phthalazine | 0.50 g/m² |
| 4-methylphthalic acid | 0.20 g/m² |
| tetrachlorophthalic acid anhydride | 0.20 g/m² |
| tetrachlorophthalic acid | 0.10 g/m² |
| LOWINOX™ 22IB46 | 2.55 g/m² |

Image-Wise Exposure and Thermal Processing

The photothermographic material was then exposed to an EG&G lamp through a L775-filter and a wedge filter with optical densities varying between 0 and 3.0 in steps of 0.15 for 30 s.

Thermal processing was carried out for 15 s with the uncoated side of the photothermographic material in contact with an aluminium drum heated to a temperature of 115° C.

The optical density variation of the resulting wedge images was evaluated in reflection with a MACBETH™ RD918-SB densitometer with a visual filter. $D_{max}$- and $D_{min}$- values of 1.78 and 0.63 respectively were thereby measured.

Delamination to Produce a Lithographic Printing Plate

The thereby exposed and thermally processed photothermographic material was delaminated by manually applying a piece of TESAPACK™ 4122, an adhesive tape supplied by BEIERSDORF, with pressure to the coated of the photothermographic material and then stripping off the tape at a speed of 6 cm s$^{-1}$ and an angle of 180°, whereupon the exposed areas of the photothermographic coating were stripped from the aluminium plate leaving the unexposed areas of the photothermographic coating unstripped thereby producing a lithographic printing plate.

Printing Experiments

An inking experiment was carried out with the resulting material using an offset printer type Sakurai Oliver 52 from Sakurai, after prewetting with deionized water. K+E 171 ink from BASF Coating & Inks was used as the printing ink in this experiment and ROTAMATIC™ Feuchtmittel R35 from ROTAPRINT as the fountain solution. Non-image areas of the lithographic printing plate were found to accept the oily and greasy lithographic ink used preferentially over the image areas. This discrimination in ink-receptive behaviour between image and non-image areas was confirmed by the visually distinct negative prints obtained upon printing onto 80 g/m² offset paper.

Having described in detail preferred embodiments of the current invention, it will now be apparent to those skilled in the art that numerous modifications can be made therein without departing from the scope of the invention as defined in the following claims.

I claim:

1. A substantially light-insensitive thermographic material, capable of being used to produce a lithographic printing plate, comprising a support, a hydrophobic thermosensitive layer and a hydrophilic surface adjoining said hydrophobic thermosensitive layer, said hydrophobic thermosensitive layer containing an ingredient A which upon heating reacts with at least one other ingredient B, in thermal working relationship with said ingredient A, producing a moiety which changes the adhesion between said hydrophobic thermosensitive layer and said adjoining hydrophilic surface, wherein, if ingredient A or B is an organic metal salt and the other ingredient A or B is a reducing agent for the organic metal salt, said reducing agent is selected from the group of reducing agents consisting of aromatic compounds having at least two hydroxy groups in ortho or para positions on the same aromatic nucleus; aminophenols; p-phenylenediamines; alkoxynaphthols; pyrazolidin-3-ones; pyrazolin-5-ones; indan-1, 3-dione derivatives; hydroxy tetrone acids; hydroxy tetronimides; hydroxylamine derivatives; hydrazine derivatives; and reductones.

2. The substantially light-insensitive thermographic material according to claim 1, wherein said hydrophobic thermosensitive layer is the outermost layer.

3. A photothermographic material, capable of being used to produce a lithographic printing plate, comprising a support, a hydrophobic thermosensitive layer and a hydrophilic surface adjoining said hydrophobic thermosensitive layer, said hydrophobic thermosensitive layer containing an ingredient A which upon heating reacts with at least one other ingredient B, in thermal working relationship with said ingredient A, producing a moiety which directly changes the adhesion between said hydrophobic thermosensitive layer and said adjoining hydrophilic surface, wherein a photosensitive agent is present in said hydrophobic thermosensitive layer which after exposure is capable of catalyzing said reaction between said ingredient A and said ingredient B to produce said moiety which directly changes the adhesion between said hydrophobic thermosensitive layer and said adjoining hydrophilic surface, wherein, if ingredient A or B is an organic metal salt and the other ingredient A or B is a reducing agent for the organic metal salt, said reducing agent is selected from the group of reducing agents consisting of aromatic compounds having at least two hydroxy groups in ortho or para positions on the same aromatic nucleus; aminophenols; p-phenylenediamines; alkoxynaphthols; pyrazolidin-3-ones; pyrazolin-5-ones; indan-1, 3-dione derivatives; hydroxy tetrone acids; hydroxy tetronimides; hydroxylamine derivatives; hydrazine derivatives; and reductones.

4. The substantially light-insensitive thermographic material according to claim 1, wherein said hydrophobic thermosensitive layer is provided on a hydrophilic surface.

5. The substantially light-insensitive thermographic material according to claim 1, wherein said hydrophilic surface is the surface of a hydrophilic layer.

6. The substantially light-insensitive thermographic material according to claim 1, wherein said hydrophilic surface is the surface of said support.

7. A substantially light-insensitive thermographic material, capable of being used to produce a lithographic printing plate, comprising a support, a hydrophobic thermosensitive layer and a hydrophilic surface adjoining said hydrophobic thermosensitive layer, said hydrophobic thermosensitive layer containing an ingredient A which upon heating reacts with at least one other ingredient B, in thermal working relationship with said ingredient A, producing a moiety which changes the adhesion between said hydrophobic thermosensitive layer and said adjoining hydrophilic surface, wherein said hydrophilic surface is a surface of a hydrophilic layer and said hydrophilic layer is the outermost layer.

8. A method of producing a lithographic plate comprising the steps of: (i) positive or negative image-wise thermal development of a substantially light-insensitive thermographic material, capable of being used to produce a lithographic printing plate, comprising a support, a hydrophobic thermosensitive layer and a hydrophilic surface adjoining said hydrophobic thermosensitive layer, said hydrophobic thermosensitive layer containing an ingredient A which upon heating reacts with at least one other ingredient B, in thermal working relationship with said ingredient A, producing a moiety which changes the adhesion between said hydrophobic thermosensitive layer and said adjoining hydrophilic surface, wherein, if ingredient A or B is an organic metal salt and the other ingredient A or B is a reducing agent for the organic metal soap, said reducing agent is selected from the group of reducing agents consisting of aromatic compounds having at least two hydroxy groups in ortho or para positions on the same aromatic nucleus; aminophenols; p-phenylenediamines; alkoxynaphthols; pyrazolidin-3-ones; pyrazolin-5-ones; indan-1, 3-dione derivatives; hydroxy tetrone acids; hydroxy tetronimides; hydroxylamine derivatives; hydrazine derivatives and; reductones; and (ii) positive or negative image-wise separation of said hydrophobic thermosensitive layer from said adjoining hydrophilic surface.

9. A method of producing a lithographic plate comprising the steps of: (i) positive or negative image-wise exposure with actinic radiation of a thermographic material, capable of being used to produce a lithographic printing plate, comprising a support, a hydrophobic thermosensitive layer and a hydrophilic surface adjoining said hydrophobic thermosensitive layer, said hydrophobic thermosensitive layer containing an ingredient A which upon heating reacts with at least one other ingredient B, in thermal working relationship with said ingredient A, producing a moiety which directly changes the adhesion between said hydrophobic thermosensitive layer and said adjoining hydrophilic surface, wherein, if ingredient A or B is an organic metal soap and the other ingredient A or B is a reducing agent for the organic metal salt, said reducing agent is selected from the group of reducing agents consisting of aromatic compounds having at least two hydroxy groups in ortho or para positions on the same aromatic nucleus; aminophenols; p-phenylenediamines; alkoxynaphthols; pyrazolidin-3-ones; pyrazolin-5-ones; indan-1, 3-dione derivatives; hydroxy tetrone acids; hydroxy tetronimides; hydroxylamine derivatives; hydrazine derivatives; and reductones; and further wherein a photosensitive agent is present in said hydrophobic thermosensitive layer which after exposure is capable of catalyzing said reaction between said ingredient A and said ingredient B to produce said moiety which directly changes the adhesion between said hydrophobic thermosensitive layer and said adjoining hydrophilic surface; (ii) thermal development of said image-wise exposed thermographic material; and (iii) positive or negative image-wise separation of said hydrophobic thermosensitive layer from said adjoining hydrophilic surface.

10. The photothermographic material according to claim 3, wherein said hydrophobic thermosensitive layer is provided on a hydrophilic surface.

11. The photothermographic material according to claim 3, wherein said hydrophilic surface is the surface of a hydrophilic layer.

12. The photothermographic material according to claim 3, wherein said hydrophilic surface is the surface of said support.

13. The photothermographic material according to claim 3, wherein said hydrophobic thermosensitive layer is the outermost layer.

14. The photothermographic material according to claim 11, wherein said hydrophilic layer is the outermost layer providing an adjoining hydrophilic surface for said hydrophobic thermosensitive layer.

15. A method of producing a lithographic plate comprising the steps of: (i) positive or negative image-wise thermal development of a substantially light-insensitive thermographic material, capable of being used to produce a lithographic printing plate, comprising a support, a hydrophobic thermosensitive layer and a hydrophilic surface adjoining said hydrophobic thermosensitive layer, said hydrophobic thermosensitive layer containing an ingredient A which upon heating reacts with at least one other ingredient B, in thermal working relationship with said ingredient A, producing a moiety which changes the adhesion between said hydrophobic thermosensitive layer and said adjoining hydrophilic surface, and (ii) positive or negative image-wise separation of said hydrophobic thermosensitive layer from said adjoining hydrophilic surface, wherein the separation is not performed by use of a solvent.

16. A method of producing a lithographic plate comprising the steps of: (i) positive or negative image-wise exposure with actinic radiation of a thermographic material, capable of being used to produce a lithographic printing plate, comprising a support, a hydrophobic thermosensitive layer and a hydrophilic surface adjoining said hydrophobic thermosensitive layer, said hydrophobic thermosensitive layer containing an ingredient A which upon heating reacts with at least one other ingredient B, in thermal working relationship with said ingredient A, producing a moiety which directly changes the adhesion between said hydrophobic thermosensitive layer and said adjoining hydrophilic surface wherein a photosensitive agent is present in said hydrophobic thermosensitive layer which after exposure is capable of catalyzing said reaction between said ingredient A and said ingredient B to produce said moiety which directly changes the adhesion between said hydrophobic thermosensitive layer and said adjoining hydrophilic surface; (ii) thermal development of said image-wise exposed thermographic material; and (iii) positive or negative image-wise separation of said hydrophobic thermosensitive layer from said adjoining hydrophilic surface, wherein the separation is not performed by use of a solvent.

\* \* \* \* \*

UNITED STATES PATENT AND TRADEMARK OFFICE
CERTIFICATE OF CORRECTION

PATENT NO.     : 5,972,556  
DATED          : October 26, 1999  
INVENTOR(S)    : Luc Leenders Page 1 of 1

It is certified that error appears in the above-identified patent and that said Letters Patent is hereby corrected as shown below:

Column 12,  
Line 60, insert

| | |
|---|---|
| Butvar™ B76: | polyvinylbutyral from MONSANTO; |
| LOWINOX™ 22IB46: | 2-propyl-bis (2-hydorxy-3, 5 – dimethylphenyl) methane from CHEM. WERKE LOWI; |
| TMPS: | tribromomethyl benzenesulfinate; |

Column 13,  
Line 2, insert  
(flush left above the formula graphic) -- SENSI: --;

Column 13,  
Line 24, insert -- and in the protective layer:

| | |
|---|---|
| CAB: | cellulose acetate butyrate, CAB-171-15S from EASTMAN; |
| PMMA: | polymethylmethacrylate, Acryloid™ K120N from ROHM & HASS; |
| LOWINOX™ 22IB46: | 2– propyl-bis (2-hydroxy-3, 5-dimethylphenyl) methane from CHEM. WERKE LOWI. |

Column 13,  
Line 32,  
"1751µm" should read -- 175µm --.

Signed and Sealed this

Twenty fifth Day of September, 2001

*Attest:*

*Attesting Officer*

NICHOLAS P. GODICI  
*Acting Director of the United States Patent and Trademark Office*